United States Patent
Koning et al.

(10) Patent No.: US 7,530,164 B2
(45) Date of Patent: May 12, 2009

(54) WAFER-LEVEL UNDERFILL PROCESS MAKING USE OF SACRIFICIAL CONTACT PAD PROTECTIVE MATERIAL

(75) Inventors: Paul Koning, Chandler, AZ (US); Terry Sterrett, Cave Creek, AZ (US)

(73) Assignee: Intel Corporation, Santa Clara, CA (US)

( * ) Notice: Subject to any disclaimer, the term of this patent is extended or adjusted under 35 U.S.C. 154(b) by 412 days.

(21) Appl. No.: 11/341,146

(22) Filed: Jan. 27, 2006

(65) Prior Publication Data

US 2006/0121646 A1 Jun. 8, 2006

Related U.S. Application Data

(62) Division of application No. 10/165,551, filed on Jun. 7, 2002, now Pat. No. 7,059,048.

(51) Int. Cl.
*H01R 9/00* (2006.01)
*H05K 3/00* (2006.01)

(52) U.S. Cl. .............................. 29/842; 29/832; 29/848; 257/788; 438/612

(58) Field of Classification Search ........... 29/830–832, 29/834, 837–841, 848, 852; 156/273.3, 275.7; 174/534, 539, 256; 228/180.21; 257/686, 257/777, 778, 787, 788; 438/108, 113, 612
See application file for complete search history.

(56) References Cited

U.S. PATENT DOCUMENTS

| | | | |
|---|---|---|---|
| 3,915,729 A | 10/1975 | Eustice | |
| 3,998,374 A | 12/1976 | Cranston et al. | |
| 4,328,262 A * | 5/1982 | Kurahashi et al. | 438/702 |
| 5,384,952 A * | 1/1995 | Matsui | 29/840 |
| 6,420,788 B1 * | 7/2002 | Chen | 257/777 |
| 6,660,624 B2 * | 12/2003 | Tzeng et al. | 438/612 |
| 6,756,540 B2 | 6/2004 | Hedler et al. | |

OTHER PUBLICATIONS

Burress, Robert V., Capote, Albert M., Lee,Yong-Joon, Lenos, Howard A., & Zamora, Jeffrey F. "A Practical, Flip-Chip, Multi-layer Pre-Encapsulation Technology for Wafer-Scale Underfill" 2001 Electronic Components and Technology Conference 2001 IEEE.

(Continued)

*Primary Examiner*—Donghai D. Nguyen
(74) *Attorney, Agent, or Firm*—Blakely, Sokoloff, Taylor & Zafman LLP

(57) ABSTRACT

A method for connecting electronic components, such as, an integrated circuit die and a package substrate, is described. According to one aspect of the invention, a contact pad protective material is applied on one or more of the contact pads on an integrated circuit die. The underfill material is applied to the surface of the die not covered by the contact pad protective material and the underfill material is partially cured in a curing oven. The contact pad material is removed leaving openings over the respective surface of the contact pad. A one or more contacts on a package substrate is inserted into the openings, electronically connecting the contacts to the contact pads.

15 Claims, 8 Drawing Sheets

OTHER PUBLICATIONS

Gilleo, Dr. Ken & Blumel, David. "Transforming Flip Chip into CSP with Reworkable Wafer-Level Underfill" Alpha Metals Jersey City, NJ, pp. 159-165 1999.

Johnson, Dustin C., Baldwin Ph.D., Daniel F. "Wafer Scale Packaging Based on Underfill Applied at the Wafer Level for Low-Cost Flip Chip Processing" 1999 Electronic Components and Technology Conference. 1999 IEEE.

Nguyen L., and Nguyen, H. "Solder Joint Shape Formation Under Constrained boundaries in Wafer Level Underfill" 2000 Electronic Components and Technology Conference. 2000 IEEE.

Crane Ph.D., Lawrence, Torres, Ph.D., Alfranio & Yaeger, Erin. "Reworkable Underfills Development, Processing and Reliability" Laboratory for Advance Electronic Packaging Auburn University. Sep. 1, 1998.

Ma, Bodan; Tong, Quinn K.; Zhang Eric, Hong, Sun Hee & Savoca, Ann "Materials Challenges for Wafer-Level Flip Chip Packaging" 2000 Electronic Components and Technology Conference, 2000 IEEE.

Tong, Quinn K.; Ma, E.; Zhang Eric, Hong, Savoca, Ann; Nguyen, L.; Quentin, C.; Luo, Shijian H.; Li, Fan L. & Wong, C.P. "Recent Advances on a Wafer-Level Flip Chip Packaging Process" 2000 Electronic Components and Technology Conference. 2000 IEEE.

Keser, Berth; Yeung, Betty; White, Jerry, & Fang Treliant. "Encapsulated Double-Bump WL-CSP: Design and Reliablity" 2001 Electronic Components and Technology Conference. 2001 IEEE.

Shi, S.H.; Yamashita, T.; and Wong, C.P. "Development of the Wafer Level Compressive-Flow Underfill Process and Its Required Materials" 1999 Electronic Components and Technology Conference. 1999 IEEE.

Nguyen, L.; Kelkar, N.; and Takiar H. "A Manufacturing Perspective of Wafer Level CSP" 2000 Electronic Components and Technology Conference. 2000 IEEE.

Topper, M.; Auersperg J.; Glaw, V.; Kaskoun, K.; Prack E. Keser, B.; Coskina, P.; Jager, D.; Ehrmann, Petter O.; Samulewicz, K.; Meinherz, C.; Fehlberg, S.; Karduck, C.; Reichl, H. "Fab Integrated Packaging (FIP) A New Concept for High Reliability Wafer-Level Chip size Packaging" 2000 Electronic Components and Technology Conference. 2000 IEEE.

Lau, John H. "Critical Issues of Wafer Level Chip Scale Package (WLCSP) With Emphasis On Cost Analysis and Solder Joint Reliability" 2000 IEEE/CMPT Int'l Manufacturing Technology Symposium. 2000 IEEE.

Crane, Larry; Konarski, Mark, Yaeger, Erin "Compatibility of Current Flipchip Process with Lead Free Solder Bumps" International Microelectronics and Packaging Society Nordic Chapter. Sep. 23-26, 2001.

* cited by examiner

WAFER-LEVEL UNDERFILL PROCESS MAKING USE OF SACRIFICIAL CONTACT PAD PROTECTIVE MATERIAL

CROSS-REFERENCE TO OTHER APPLICATIONS

This is a divisional of U.S. patent application Ser. No. 10/165,551, filed on Jun. 7, 2002, issued as U.S. Pat. No. 7,059,048 on Jun. 13, 2006.

BACKGROUND

1. Field

Embodiments of the invention relate to the field of integrated circuit packaging and, more specifically, to microprocessor flip chip packaging.

2. Background

One method of connecting a semiconductor die onto a package substrate is known in the art as controlled collapse chip connection (C4) flip chip manufacturing. Flip chip manufacturing includes a semiconductor die having contact pads (e.g., electric terminals) placed on one side of the die so that it can be flipped over and bonded with adhesive with the contact pads providing an electrical connection with contact bumps on a package substrate. Such adhesives are typically filled fine silica particles in order to compensate for differences in coefficient of thermal expansion (CTE) between flip chip components. It is therefore desirable that adhesive formulations have high filler concentrations so as to more closely match the CTE of the components comprising the flip chip device.

A common method of applying such adhesives is to dispense a small amount of liquid adhesive along the edge of the die allowing it to flow under the die via capillary action. While this process has proven to be useful it has several limitations related to cost and adhesive formulation. Cost is relatively high because the assemblies must be individually handled numerous times in order to dispense the adhesive. The amount of filler that can be formulated into such as adhesives is quite limited because the material must have a relatively low viscosity in order to effectively flow under the die via capillary action. Typical capillary underfilling adhesive materials are limited to filler concentrations no greater than 70% by weight, thus limiting the ability to tailor the CTE of the material to values more closely matching those possessed by the other components comprising the flip chip device.

In addition, problems occur when the adhesive used to bond the die with package substrate sets between the contact pads and contact bumps. For example, when the adhesive is set between the contact pads and the contact bumps, the electrical connection between the die and the package substrate is lessened. That is, the adhesive interferes with the electrical connection between the die and the package substrate.

BRIEF DESCRIPTION OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
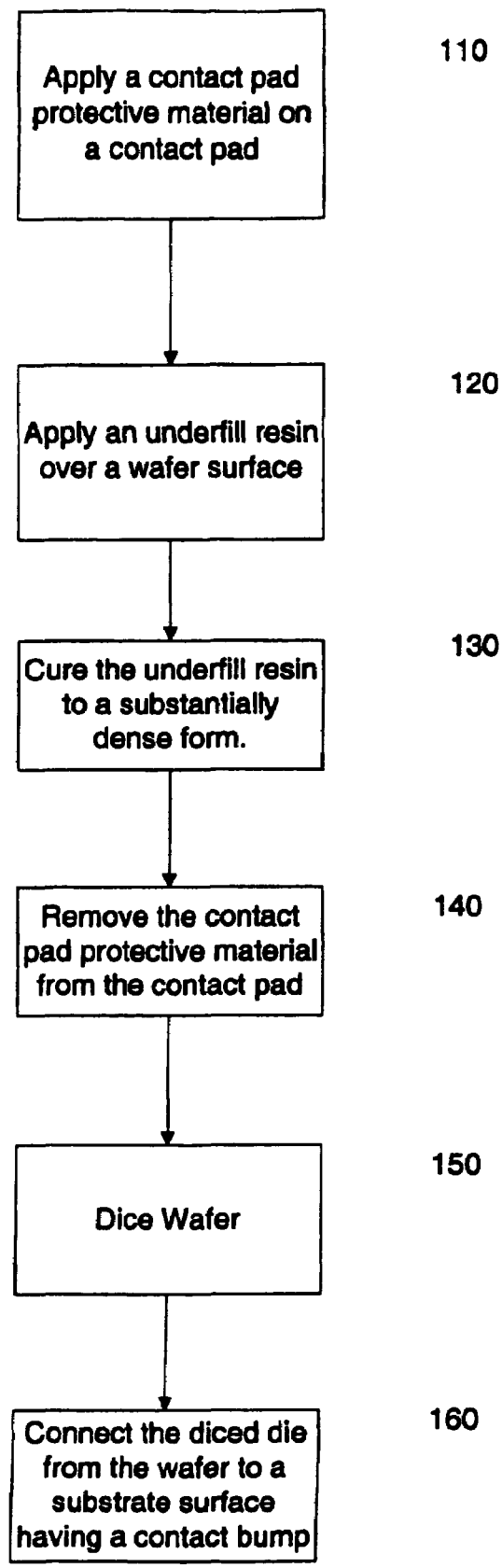
FIG. 1 illustrates a process flow of an underfill coating process using a contact pad protective material according to one embodiment of the invention.

A method for applying an underfill material between electronic components, such as an integrated circuit die and a package substrate using a contact pad protective material, is described. FIG. 1 is used with FIGS. 2A, 2B, 2C, 2D, 2E, 2F, and 2G to illustrate one embodiment of an underfill coating process using a contact pad protective material.

Figure 2A:
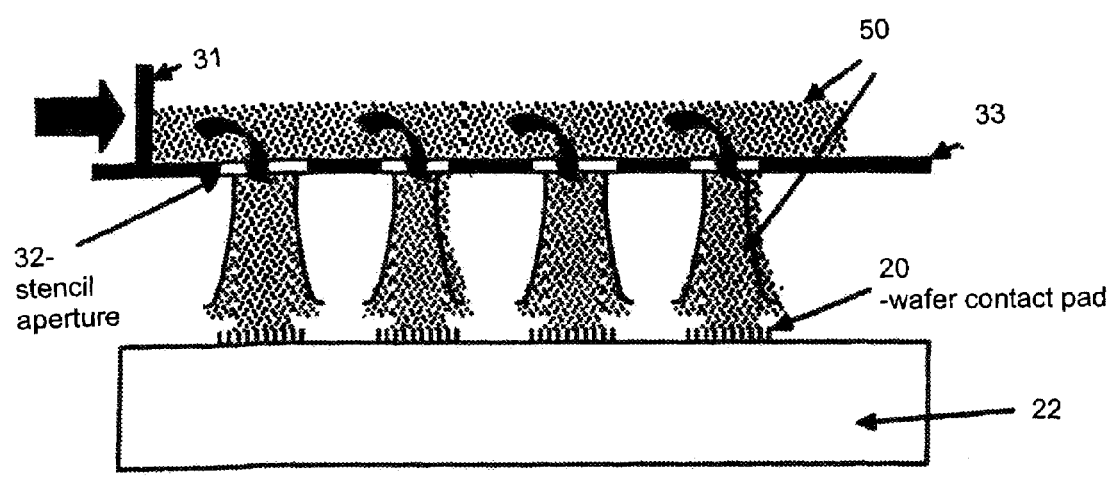
FIG. 2A is a cross-section view of a contact pad protective material stencil printing detail according to one embodiment of the invention.

At 110, a contact pad protective material 50 is applied on one or more contact pads 20 on a wafer 22 in FIG. 2A, the wafer 22 having a plurality of silicon die and, each die having one or more contact pads as described. The contact pad protective material 50 covering the contact pads 20 is to prevent an underfill material from covering one or more contact pads 20, as will be described. The contact pad protective material 50 may be stencil printed onto the surface of wafer 22 with a contact pad protective material stencil 33. The contact pad protective material stencil 33 may be manufactured so as to have contact pad protective material stencil apertures 32 of appropriate design for applying the contact pad protective material 50 onto the corresponding contact pads 20 on the wafer 22 using a stencil squeegee 31 to apply contact pad protective material 50. However, it should be understood that embodiments of the invention are not limited to using the contact pad protective material stencil 33 to applying the contact pad material 50, and in alternative embodiments other techniques, such as screen printing, which is well known to those of ordinary skill in the art, might also be used within the scope of the embodiments.

Figure 2B:
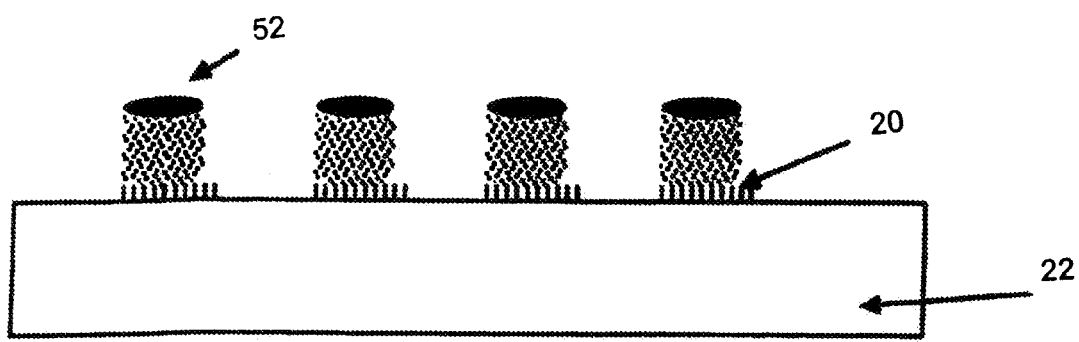
FIG. 2B is a cross-section view of contact pad protective material structures printed onto a wafer contact pad surface according to one embodiment of the invention.

Contact pad protective material 50 is formulated so as to allow for the formation of contact pad protective material structures 52 on each contact pad 20, as shown in FIG. 2B. The contact pad protective material stencil 33 may be fabricated in accordance with a desired contact pad protective structure 52, pitch, and height. For example, a contact pad protective structure may have a pitch range greater than 150 um and a height in the range of 20 to 30 um or greater.

In one embodiment, the contact pad protective material 50 may comprise a polymer, such as polystyrene in a non-aqueous solution with a solvent such as acetone, as well as an aqueous solution of polyvinyl alcohol, among other examples. Typically such materials have viscosity in the range of 1000 to 10000 cPS allowing for patterning and formation of the contact pad protective material structures 52 using stencil printing or similar processes.

Figure 2C:
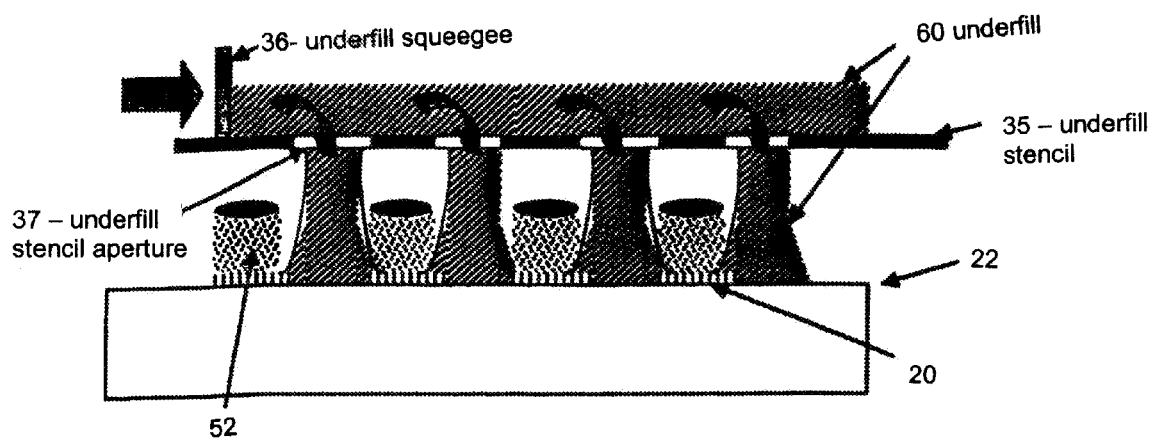
FIG. 2C is a cross-section view of an underfill stencil printing detail according to one embodiment of the invention.

At 120, an underfill material 60 is applied over the unprotected surface of wafer 22 via underfill stencil 35, as shown in FIG. 2C. Underfill stencil 35 is manufactured so as to have underfill stencil apertures 37 and a printing pattern appropriate for placing the underfill material 60 on the wafer between the contact pad protective material structures 52 using a underfill stencil squeegee 36. The underfill material 60 may be comprised of the general class of materials known as epoxies, including an amine epoxy, an imidizole epoxy, an phenolic epoxy or an anhydride epoxy system, among similar chemistries well known to those of ordinary skill in the art. In addition, other examples of underfill material 60 may include underfills such as benzocyclobutene (BCB), a bismalleimide type underfill, a polybenzoxazine system, or a polynorborene type underfill, among other examples. Also, the underfill material 60 may optionally be filled with inorganic fillers such as silica to control the thermal expansion of material 60. It should be appreciated that the underfill material 60 does not have to exhibit good capillary flow in the embodiments of this invention. Therefore, if a filler is used, it can be used at a much higher level fill than a normal capillary style underfill. This in turn allows for greater freedom to achieve low CTE in underfill material 60 through higher filler loadings.

Figure 2D:
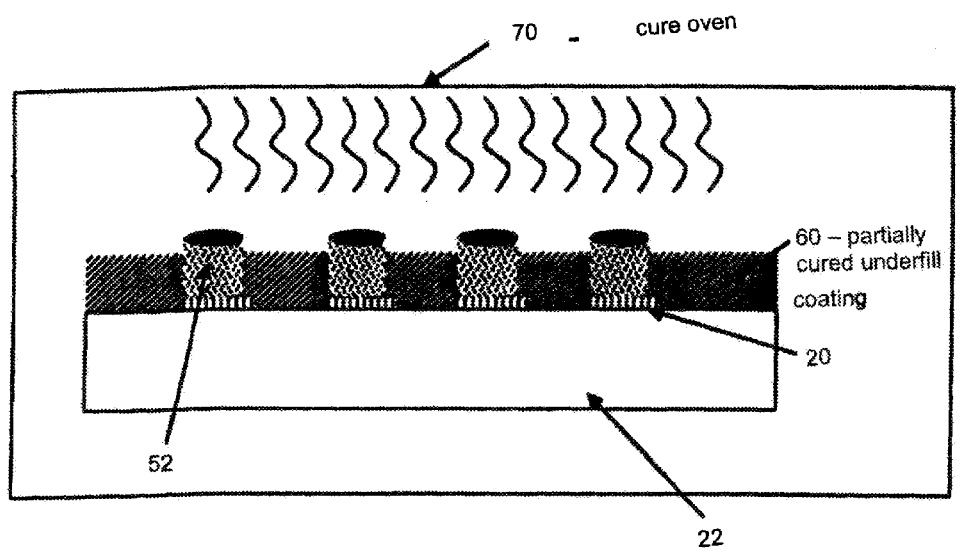
FIG. 2D is a cross-section view of partially cured underfill coating surrounding the contact pad protective material in a cure oven according to one embodiment of the invention.

At 130, the underfill material 60 is partially cured to a substantially dense form as shown in FIG. 2D. Here, the wafer 22 coated with underfill material 60 is placed in a curing oven 70 (e.g., a thermal cure oven, a microwave oven, etc.) in order to partially cure the underfill material 60. In one embodiment, the time, temperature, and environmental conditions of curing the oven 70 depend on the contact pad protective material 50, underfill material chemistry, and the degree of cure required.

For example, if underfill resin 60 is an epoxy material and the target degree of cure is in the range of sixty to eighty percent, the curing oven 70 conditions are in the following range: (1) time=ten to sixty minutes; (2) temperature=forty to sixty degrees Celsius; and (3) environmental conditions=ambient air. Maximum curing temperature should be adjusted in accordance with the melting point of the contact pad protective material 50. The curing temperature for the underfill material 60 should be less than the melting point of the contact pad protective material 50. For example, the underfill partial curing temperature should be ten to twenty degrees Celsius below the contact pad protective material 50 melting point.

Figure 2E:
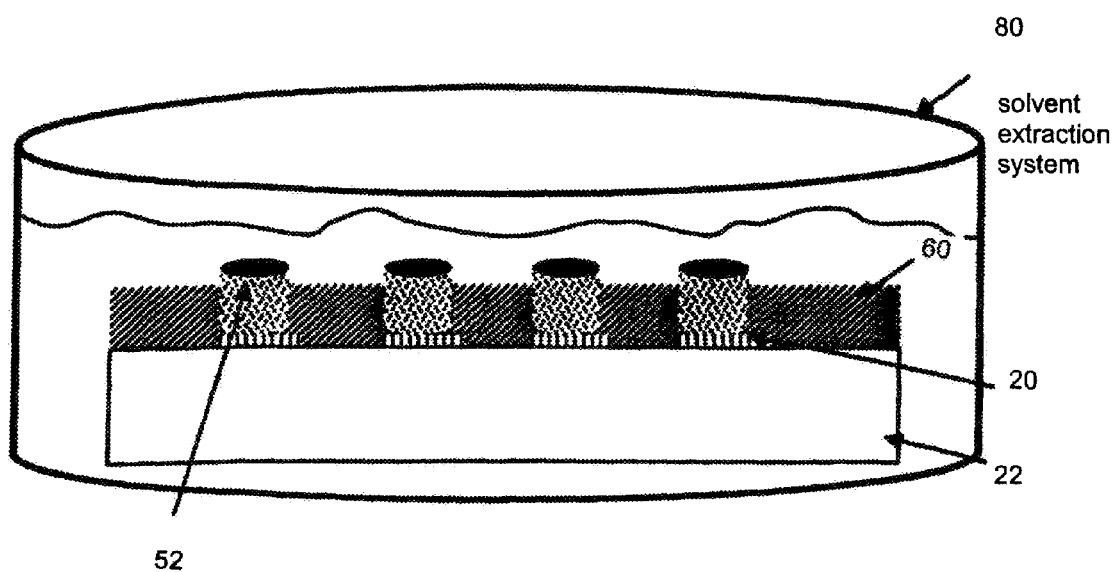
FIG. 2E is a cross-section view of a solvent extraction system used to remove the contact pad protective material according to one embodiment of the invention.

At 140, the contact pad protective material 50 is removed from the contact pad 20, as shown in FIG. 2E. Here, the contact pad protective material 50 is removed from the contact pads 20 with a solvent extraction system 80 to expose the contact pads 20 through openings in the underfill material. The wafer 22 is placed in the solvent extraction system 80 (e.g., acetone) to remove the contact pad protective structures 52. The time and temperature to remove the contact pad protective structures 52 in the solvent extraction system 60 may depend on the solvent, the contact pad protective material 50, and the underfill material 60 chemistry and degree of cure. For example, if underfill material 60 is an epoxy material and the target degree of cure is in the range of sixty to eighty percent, and the contact pad protective material 50 is a polystyrene, the solvent extraction system conditions are in the following range: (1) time=ten to five hundred seconds; and (2) temperature=room temperature to forty degrees Celsius. Maximum extraction temperature may be adjusted in accordance with the contact pad protective material 50 and the solvent agent.

Figure 2F:
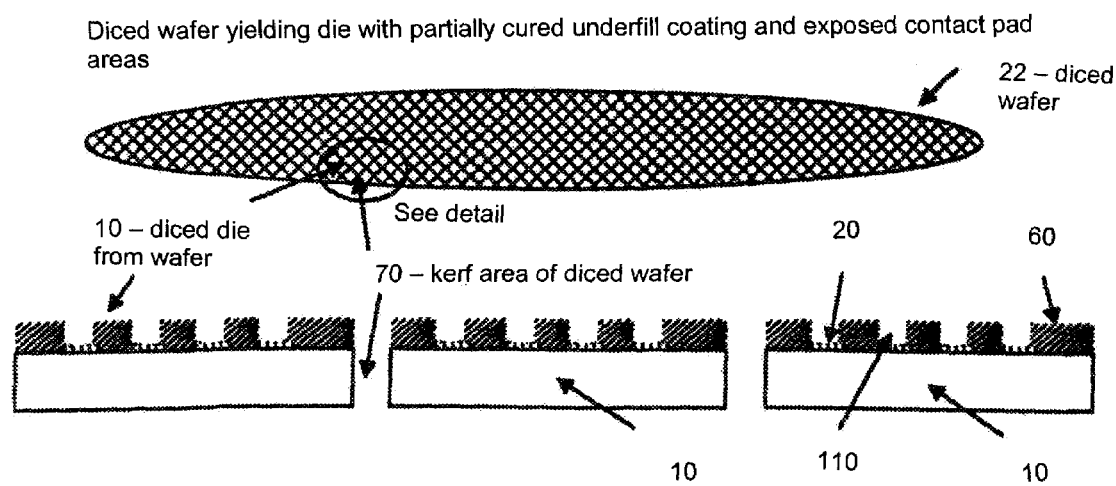
FIG. 2F is a cross-section view of a diced wafer yielding die with partially cured underfill coating and exposed contact pad areas according to one embodiment.

At 150, the wafer 22 is separated or diced into individual die. The process of yielding a diced wafer is well known to those of ordinary skill in the art. FIG. 2F shows a diced wafer 22 having a cutaway view of diced region 70. Region 70 shows three die 10 that have been cut from the wafer 22, each diced die 10 having exposed contact pads 20 between the partial cured underfill material 60.

In one embodiment, the wafer street areas, signifying where each die is to be cut from the wafer 22, may be kept clear of the underfill material 60 and the contact pad protective material 50, so as to avoid problems with sawing caused by blade loading with debris. As stated above, contact pad protective material 50 may also be applied to the wafer street areas so as to provide a means of protecting these areas from downstream wafer sawing operations. Therefore, as with contact pad protective material 50 placed over the contact pads 20, contact pad protective material 50 protecting street areas is also removed when the contact pad protective material 50 is removed so as to expose debris-free areas for sawing. Alternate embodiments of the present invention include performing wafer-sawing operations prior to applying the contact pad protective material 50 to the wafer as described in block 110. In either example, wafer 22 is sawn along kerf area 70 yielding a plurality of diced die 10 from wafer 22 to be attached to a package substrate.

In one embodiment, the plurality of diced die 10 are made available for downstream processing by leaving diced wafer 22 on a wafer ring and film. The resultant sub-assembly is placed in a conventional pick and place machine from which each die 10 are picked from the wafer ring and placed onto bumped substrate 40 having corresponding contact bumps 30.

Figure 2G:
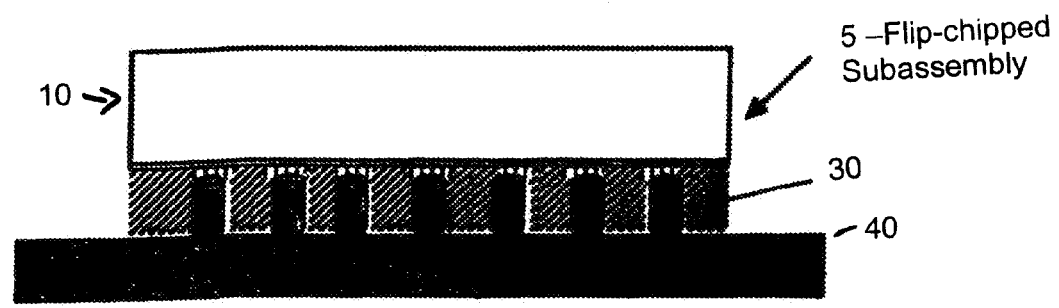
FIG. 2G is a cross-section view of an integrated circuit assembly according to one embodiment.

At 160, the die 10 having the underfill material with openings to the contact pads 20 are flip-chip attached with the package substrate 40 having the contact bumps 30, as shown in FIG. 2G. Here, the contact bumps are inserted into the openings in the underfill material to provide an electrical connection with the contact pad. For example, the diced die 10 might be picked from wafer 22 and flipped for assembly by a process well known to those of ordinary skill in the art. Alternately, the die can also be singluated and placed on a tape and reel type storage and delivery system before being picked and flipped for final assembly by a process well known to those of ordinary skill in the art.

In order to complete the electrical interconnection between die 10 and substrate 40, integrated circuit assembly 5 is placed in a reflow oven well known to those of ordinary skill in the art, in accordance with substrate bump metallurgy. For example, if the substrate bumps 30 are composed of eutectic solder (Pb/Sn 63/37), reflow conditions are typically as follows: soak at 150-160 C.; ramp to peak temperatures of 218-222 C. for ninety seconds; and total time is approximately five minutes. Reflow simultaneously causes substrate bumps 30 to flow onto the die contact pad 20 and causes the underfill 60 to cure. Alternatively, a fluxing agent or solder paste cure may be placed in the open contact pads to aid in the flip chip attachment process. Here, the top surface of the contact pad 20 may be soldered with the top surface of the contact bump 30.

It should be understood that although one or more contact pads 20 are shown on the die 10, and one or more contact bumps 30 are shown on the substrate 40, in an alternative embodiment, the one or more contact pads 20 are on the substrate 40, and one or more contact bumps 30 are on the die 10. Therefore, either the package substrate or wafer may be treated with the contact pad protective material and pre-cured with the underfill material as described, depending on the configuration of the wafer or the package substrate. In addition, although an embodiment of the invention has been described with contact bumps connecting to the contact pad, in alternative embodiments of the invention, alternative examples of connection techniques and contacts might be used such as contact pens among other examples well known to those of ordinary skill in the art. For example, according to yet another embodiment of the invention, substrate bumps 30 may be composed of electrically conductive polymeric materials, such that, the final connection between contact pads 20 and substrate bump 30 is achieved by adhesive bonding by using appropriate adhesive resin, latency of the resin comprising the matrix of polymer bump 30, or a combination thereof.

According to one embodiment of the invention, the process includes the applying of a photo-definable underfill material system onto the wafer surface having contact pads. The photo-defined underfill material may comprise a benzocyclobutene (BCB). In this way, using an appropriate mask pattern, the film is photo-defined so the underfill material lying between contact pads is partially cured. The resultant surface is exposed to a suitable solvent system so that the areas lying over the contact pad surfaces are dissolved, exposing the contact pad surface for flip chip attachment.

For example, a suitable wafer underfil material may be Dow 4021-46, a photo-definable BCB formulation that is printed on the wafer surface, and photo-defined and partially cured to seventy-five to eighty degree of cure. Exposure of the resultant structure to a polar solvent, such as a fifty-fifty blend of water and ethanol, will result in the dissolution of PVA contact pad protective material.

According to another embodiment, ablation technology, well known to those of ordinary skill in the art, may be used. Here, an underfill material is applied on the wafer including the contact pads. The underfill material areas lying over the contact pads' surfaces are ablated by either energized light (e.g., carbon dioxide laser) or plasma (e.g., argon) so that the areas lying over contact pad surfaces are exposed for subsequent flip chip attachment.

It should also be understood that the embodiments described provide for a process to interconnect an integrated circuit assembly, such that the underfill material is not between the contact pad and the contact bumps. In addition, these embodiments provide a means for applying a highly filled and CTE-tailorable material onto the wafer surfaces allowing for conventional flip chip manufacturing techniques to be used, and therefore allows for high throughput and low cost manufacturing.

While the invention has been described in terms of several embodiments, those skilled in the art will recognize that the invention is not limited to the embodiments described. The method and apparatus of the invention can be practiced with modification and alteration within the spirit and scope of the appended claims. The description is thus to be regarded as illustrative instead of limiting on the invention.

What is claimed is:

1. A method of constructing an electronic assembly, comprising:

applying a contact pad protective material on a contact pad, the contact pad being on a surface of a first electronic component;

applying an underfill material, different from the contact pad protective material, over the surface of the first electronic component;

removing a portion of the contact pad protective material from the contact pad to form an opening that exposes the contact pad on the first electronic component; and connecting the first electronic component to a second electronic component having a contact, the connecting includes inserting the contact into the opening that exposes the contact pad to provide an electrical connection between the contact and the contact pad, wherein applying the underfill material further comprises using a underfill stencil to stencil print the underfill material onto the surface of the first electronic component.

2. The method of claim 1 wherein applying the contact pad protective material further comprises using a contact pad protective material stencil to stencil print the contact pad protective material onto the contact pad.

3. The method of claim 1 wherein the contact pad protective material is polymer.

4. The method of claim 3 wherein the contact pad protective material is a acetone solution of polystyrene.

5. The method of claim 1 wherein the contact pad protective material is an aqueous solution of polyvinyl alcohol.

6. The method of claim 1 wherein the underfill material is an epoxy.

7. The method of claim 1 wherein the underfill material is an amine epoxy.

8. The method of claim 1 wherein the underfill material is a benzocyclobutene epoxy.

9. The method of claim 1 wherein the curing temperature for the underfill material is less than the melting point of the contact pad protective material.

10. The method of claim 1 wherein the removing the contact pad protective material further comprises exposing the contact pad protective material to a solvent system.

11. The method of claim 10 wherein the solvent system includes acetone.

12. The method of claim 1 wherein the connecting further comprises performing flip chip processing.

13. The method of claim 1 wherein the connecting further comprises:

re-curing the underfill material to connect the surface of the first electronic component with the second electronic component.

14. The method of claim 1 wherein the connecting further comprises:

soldering together the contact pad and the contact using a soldering material.

15. The method of claim 1 wherein the first electronic component is one of a plurality of integrated circuit die on a wafer, wherein the second electronic component is a package substrate, wherein the connecting the first electronic component further comprises dicing the first electronic component from the wafer prior to connecting the first electronic component to the second electronic component.

* * * * *